US006228726B1

United States Patent
Liaw

(10) Patent No.: US 6,228,726 B1
(45) Date of Patent: May 8, 2001

(54) METHOD TO SUPPRESS CMOS DEVICE LATCHUP AND IMPROVE INTERWELL ISOLATION

(75) Inventor: Jhon Jhy Liaw, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/519,609

(22) Filed: Mar. 6, 2000

(51) Int. Cl.⁷ .................................................. H01L 21/336
(52) U.S. Cl. .......................................... 438/294; 438/220
(58) Field of Search ..................................... 438/142, 296, 438/297, 358, 416, 424, 445, 202, 220, 294

(56) References Cited

U.S. PATENT DOCUMENTS

| 5,208,473 | 5/1993 | Komori et al. ...................... 257/345 |
| 5,338,986 | 8/1994 | Kurimoto ........................... 307/303.2 |
| 5,674,775 | * 10/1997 | Ho et al. .............................. 438/296 |
| 5,686,752 | 11/1997 | Ishimura et al. ..................... 257/369 |
| 5,719,733 | 2/1998 | Wei et al. ............................. 361/56 |
| 5,777,510 | 7/1998 | Lien .................................... 327/565 |
| 5,780,899 | 7/1998 | Hu et al. ............................. 257/335 |
| 5,831,313 | * 11/1998 | Han et al. ............................ 257/371 |
| 5,899,714 | * 5/1999 | Farrenkopf .......................... 438/202 |

* cited by examiner

Primary Examiner—David Nelms
Assistant Examiner—David Nhu
(74) Attorney, Agent, or Firm—George O. Saile; Stephen B. Ackerman

(57) ABSTRACT

A method for processing a semiconductor device with improved latchup immunity and interwell isolation is described. Shallow trench isolation areas are formed on a semiconductor substrate to provide electrical isolation for active device N and P well areas. The active areas will contain complementary pairs of NMOS and PMOS deices. A trench is etched into the substrate at the boundary region between the active device regions. Before filling and capping the trench to form a complete STI structure, first one well region such as the N-well region is masked by photoresist to the center of the trench isolation structure, and an ion implant of acceptor atoms such as boron is implanted under the bottom surface of the open trench. The process is repeated for the P-well area except a donar source such as phosphorous or arsenic is used. This provides doped regions under the trench which reduces the sheet resistance and thereby reducing the parasitic PNP and NPN emitter base resistance in series with the voltage contacts improving latchup immunity and increases the P+ to P well and N+ to N well isolation. The device processing is then continued to completion. Doping the device with the trench open is a more easily controlled process than an implant process after the well is filled and capped.

14 Claims, 3 Drawing Sheets

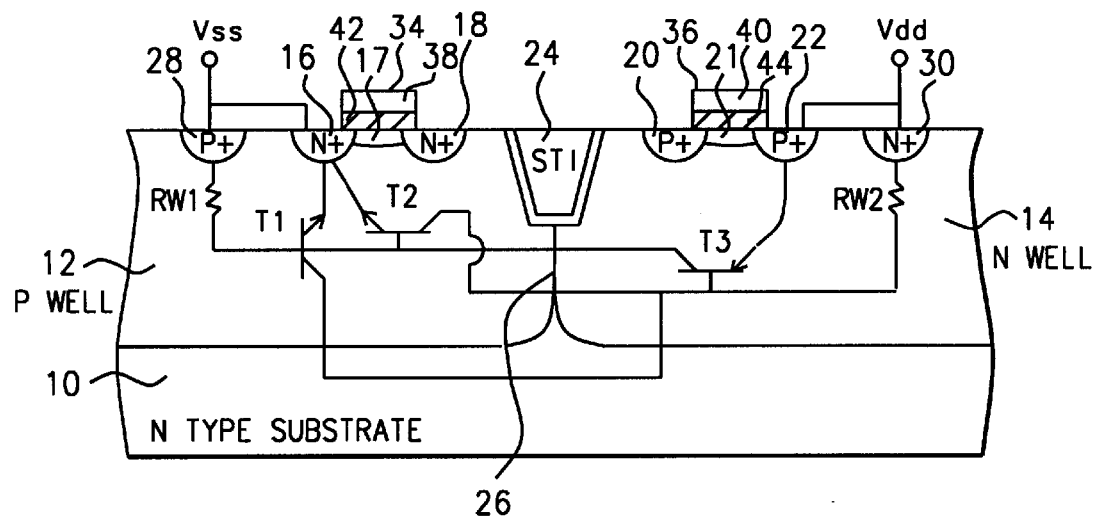
*FIG. 1 - Prior Art*
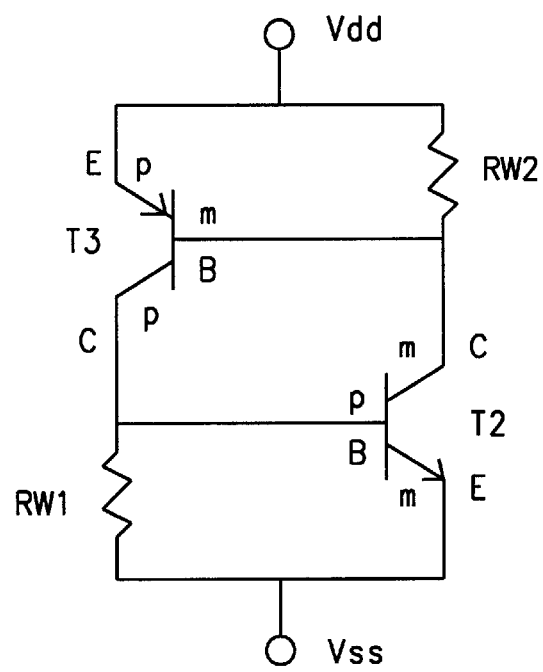
*FIG. 2 - Prior Art*

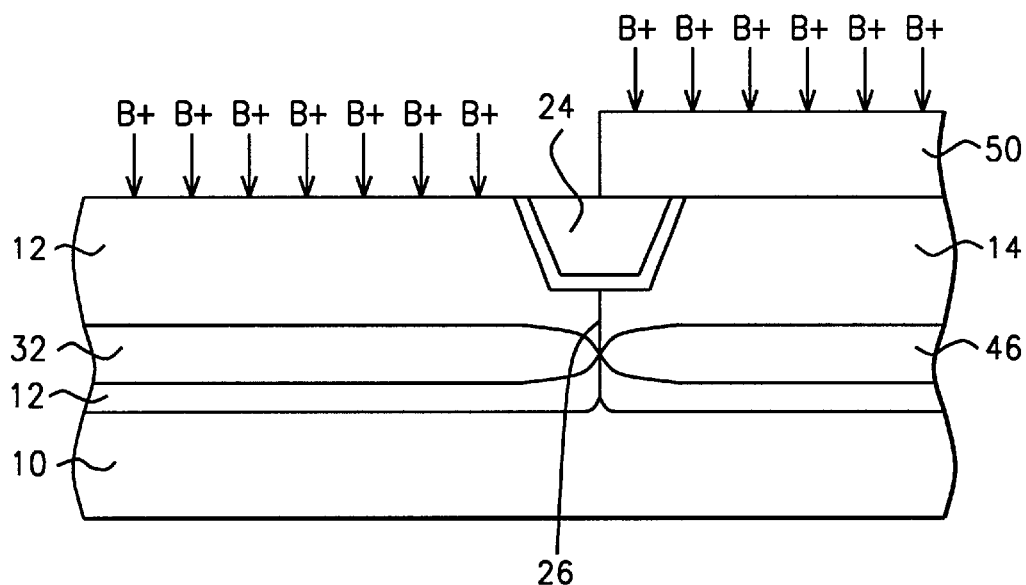
FIG. 3 - Prior Art
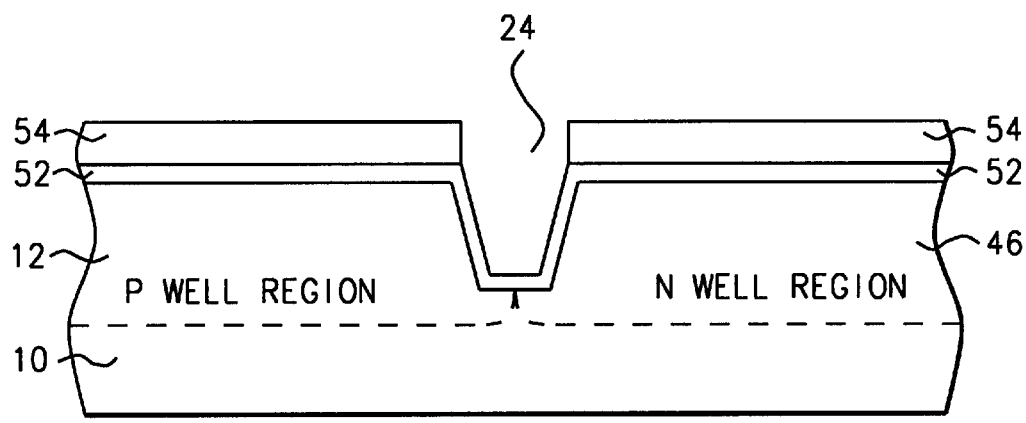
FIG. 4

METHOD TO SUPPRESS CMOS DEVICE LATCHUP AND IMPROVE INTERWELL ISOLATION

BACKGROUND OF THE INVENTION (1) Fields of the Invention

The present invention relates generally to fabrication of semiconductor devices and more particularly to a process which results in a semiconductor device structure with improved latch-up immunity and interwell isolation.

(2) Description of Prior Art

As complementary field effect transistor (FET) devices are scaled down to have feature sizes below 1.5 micrometers (um) to increase circuit density and improve device performance, several considerations become increasingly important.

One important consideration is latch-up. Latch-up is defined as a high current state which is triggered by certain electrical conditions acting on parasitic bipolar transistors contained in the device structure. Normal circuit control is generally lost when latch-up occurs. The high current generates excessive heat which can become destructive to the device. It is extremely desirable and important to design semiconductor devices with latch-up immunity.

CMOS latch-up is typically caused by parasitic bipolar transistors from the source/drain elements of the CMOS and other device elements such as the N and P wells and the substrate region. FIG. 1 is a cross sectional view of a prior art semiconductor device which is susceptible to latch-up. The device consists of a N type silicon substrate 10 having a P well 12 and a N well 14 separated by a boundary region 26. Formed within the P-well 12 are N+ source/drain regions 16, 18 and P+ contact region 28 which is connected to a first voltage source Vss, typically ground. Formed within the N well 14 are P+ source/drain regions 20, 22 and N+ contact region 30 which is connected to a second voltage source $V_{DD}$, typically 3.3 volts (V) or 5.0 V. A shallow trench isolation (STI) structure 24 is formed in a recess between the N and P-well regions, overlaying the boundary region 26. Gate structures 34 and 36, comprising of a gate electrodes 38, 40 and underlying gate oxide layer 42, 44 complete the essential elements of the N-channel metal oxide semiconductor (NMOS) and P-channel metal oxide semiconductor (PMOS) respectively. It is understood the structures are covered by a passivation layer, typically silicon dioxide ($SiO_2$) and appropriately patterned metallurgy, typically Aluminum (Al), for electrical contact. These elements are not shown for clarity.

Latch-up occurs when parasitic bipolar transistors located within the semiconductor device are connected in a positive feedback loop, shown schematically in FIG. 2. A parasitic vertical NPN bipolar transistor T1 is formed by N type source/drain regions 16,18, P-well 12 and substrate 10. A parasitic lateral NPN bipolar transistor T2, which is formed electrically in parallel with vertical NPN bipolar transistor T1, is formed by N type source/drain regions 16, 18 P-well 12 and N-well 14. A lateral parasitic PNP transistor T3 is formed by P-type source/drain regions 20, 22, N-well 14 and P-well 12.

FIG. 2 is a schematic diagram of the latchup circuit in semiconductor device. Vertical NPN bipolar transistor T1 is not shown for purpose of clarity. It is understood that vertical NPN bipolar transistor T1 is electrically in parallel with lateral NPN bipolar transistor T2. As shown in FIG. 2, the emitter of T2 is coupled through a resistor RW1 to the base of T2. The emitter of T3 is coupled through a resistor RW2 to the base of T3. The collector of T2 is coupled to the base of T3 and the collector of T3 is coupled to the base of T2. The emitter of T3 is effectively connected to Vdd and the emitter of T2 is effectively connected to Vss, commonly ground.

Latch-up occurs when the voltage drop across resistor RW2, and hence the voltage drop between the emitter E and base B of T3, is sufficient to turn T3 on. This causes current to flow between the emitter E and collector C of T3. This results in positive feedback producing a voltage drop across resistor RW1, and hence a voltage drop between the emitter E and base B of the NPN transistor T2. If the voltage drop between the emitter and base of T2 is sufficient, then T2 turns on. This causes a current to flow through the emitter and collector of T2 which increases the current flow through resistor RW2 increasing the voltage drop between the emitter and base of T3. The positive feedback loop continues resulting in latch-up.

By decreasing the values of resistors RW1 and RW2 any tendency to forward bias by creating a voltage drop between the emitter and the base of parasitic transistors T2 and T3 is reduced and latch-up immunity is improved. Although vertical parasitic NPN bipolar transistor T1 is not shown for clarity, it is understood that latchup has both a vertical and lateral component. Thus to effectively suppress latchup, both the lateral and vertical elements must be suppressed.

One conventional method to suppress latchup is to form a heavily doped region in the lower portion of P-well 12. Referring to FIG. 3, a mask 50 made of photoresist, is formed overlaying N-well area 14 and partially overlaying the STI structure 24 which is shown as a completed structure filled with $SiO_2$. The mask 50 does not extend over the P-well area 12. The structure is then subject to a high energy implant of P type impurit, shown here as B+ for Boron. The implant typically takes place with an energy between 60 KeV and 120 KeV. The P type impurity does not pass through mask 50 into the N well region 14. However, the P type dopant is introduced into a region 32 of P-well 12, creating a heavily doped region (HD) at a depth below the upper surface of the well and above the upper surface of N type substrate 10.

Since higher concentrations of dopants improve conductivity, the HD region 32 exhiibits relatively low resistance (high conductivity) which reduces the emitter base resistance and subsequently reduces the tendency for the parasitic vertical NPN transistor T1 to turn on, thus improving tolerance for latchup. However, the heavily doped region 32 as shown in FIG. 3 exhibits a lower dopent profile in the boundary region under the STI and does not inhibit lateral latchup under the STI region caused by lateral transistor T2 and T3. As feature size in semiconductor devices are further reduced, lateral latchup becomes increasingly important. Therefore it is desirable to have a method of manufacturing a semiconductor device which inhibits both lateral and vertical latchup.

A similar N+ doping process can be repeated for the N-well area of the device, resulting in a HD layer 46 which has a similar vertical latchup effect for the N-well as HD layer 32 has in the P-well but the heavily doped region 46 as shown in FIG. 3 also exhibits a lower dopent profile in the boundary region under the STI.

As the impurity concentration in the buried layers 32, 46 is increased to reduce the resistance of RW1, RW2, or the depth of the buried layer is reduced, the gate elements 34, 36 threshold voltage (Vt) is increased, thereby degrading circuit performance. Conversely, as the doping level is decreased, or the depth increased, the effect on the vertical and lateral parasitic bipolar transistors and associated resistors RW1 and RW2 is weakened, reducing the resistance to latchup. It is desirable to have a process which improves both lateral and vertical latchup tolerance, and at the same time keep constant or improve transistor threshold voltage tolerance.

Another important consideration in semiconductor technology is interwell isolation, i.e., it is important to prevent current leakage between N-well and P-well. Interwell isolation can further be broken down in to $N^+$ type source/drain region to N-well isolation, and $P^+$ type source/drain region to P-well isolation. As feature size in semiconductor devices are further reduced and the $N^+$ to N well and $P^+$ to P well spacing decreases, interwell isolation becomes increasingly important.

U.S. Pat. No. 5,208,473 issued to Komori et al shows a lightly doped field effect transistor (FET) with reduced latchup susceptibility from an ion implant in the well under the source drain. U.S. Pat. No. 5,777,510 to Lien, and U.S. Pat. No. 5,686,752 to Ishimura et al show a high voltage driver and buffer element respectably to increase latchup tolerance. U.S. Pat. No. 5,831,313 to Han et al shows a doped region below the wells to improve latchup resistance. U.S. Pat. No. 5,780,899 to Hu et al discloses a deep N-well and shallow trench isolation (STL) that improve latchup resistance. U.S. Pat. No. 5,719,733 to Wei et al shows an electrostatic discharge (ESD) protection circuit that helps in preventing latchup. U.S. Pat. No. 5,338,986 to Kurimoto shows a design with a series resistive element to reduce parasitic transistor current and hence improve latchup resistance.

SUMMARY OF THE INVENTION

Accordingly, it is the primary objective of the invention to provide an effective and manufacturable method for improving semiconductor device resistance to the phenomenon known as latchup which restricts or destroys circuit operation and is achieved by implanting dopants within the N and P well regions under the STI region of a partially manufactured integrated circuit prior to filling the trench with the isolating material.

It is a further object of the invention to improve the N well to P well isolation including the associated $N^+$ to N well and $P^+$ to P well isolation by implanting dopants under the STI region.

Yet another objective of the invention is to achieve an improvement in device latchup immunity and interwell isolation while maintaining important device characteristics such as threshold voltage (Vt).

A still further objective of the invention is to simplify the manufacture of FET semiconductor devices while at the same time maintaining device isolation and proper operation by eliminating field implants within the semiconductor substrate to improve circuit isolation that may be difficult to control.

The above objectives are achieved in accordance with the methods of the invention which describes a process for manufacturing semiconductor devices with improved latchup immunity as well as improved interwell isolation, while maintaining important device characteristics. In this process an N well and a P well region are defined on a suitable semiconductor substrate such as an N doped silicon substrate, with the intention of forming a complimentary pair of transistors consisting of a N-channel and P-channel metal oxide semiconductors. Using suitable methods to define these regions, a shallow trench is etched for device isolation. It is the method of this invention to suitably mask the N well region and provide an acceptor implant, typically boron (B), into the P well region side of the area immediately underlying the trench opening before the trench opening is filled with the isolating dielectric, typically silicon dioxide ($SiO_2$).

The N well area mask is then removed, a P well area mask provided, and an appropriate donor, typically arsenic (As) or phosphorous (P) is implanted into the area immediately under the N well area side of the unfilled trench. These implants provide a well controlled doped region under the trench which provides increased resistance to latchup and improves $N^+$ to N well and $P^+$ to P well isolation.

BRIEF DESCRIPTION OF THE DRAWINGS

FIG. 1 shows a cross section through 2 adjacent typical complimentary metal oxide semiconductors illustrating the parasitic bipolar transistors responsible for latchup.

FIG. 2 is a schematic diagram of the latch-up circuit of the semiconductor device shown in FIG. 1.

FIG. 3 is a cross section view of a prior art semiconductor device having a $P^+$ type heavily doped region formed at or near the lower boundary of the P well region and a $N^+$ heavy doped region near the lower boundery of the N well region.

FIG. 4 is a cross section view of a semiconductor device with an isolation trench opened between the P and N-well regions.

DESCRIPTION OF THE PREFERRED EMBODIMENTS

Referring to FIG. 4 there is shown a cross section through a partially manufactured semiconductor device such as could be part of an integrated circuit. The substrate on which the active circuit elements are to be built is a body of N type silicon of single crystal orientation 10. N and P well regions have been defined within the substrate as the basis for the active device areas for complementany NMOS and PMOS FET devices. The substrate surface is covered by a layer of silicon dioxide ($SiO_2$) 52, sometimes referred to as pad oxide, or stress relief oxide. This in turn is covered with a layer of silicon nitride ($Si_3N_4$) 54 for surface protection and masking purposes. The device has been appropriately patterned with a first patterning element and etched with a suitable etch process such as a reactive ion etch (RIE) to form the trench opening 24 that will be used to isolate the N and P well areas. After the trench has been formed, a layer of $SiO_2$ 52 is grown over the trench sidewalls and bottom to a thickness of between 50 and 300 Å, again for passivation and protection.

Figure 5:
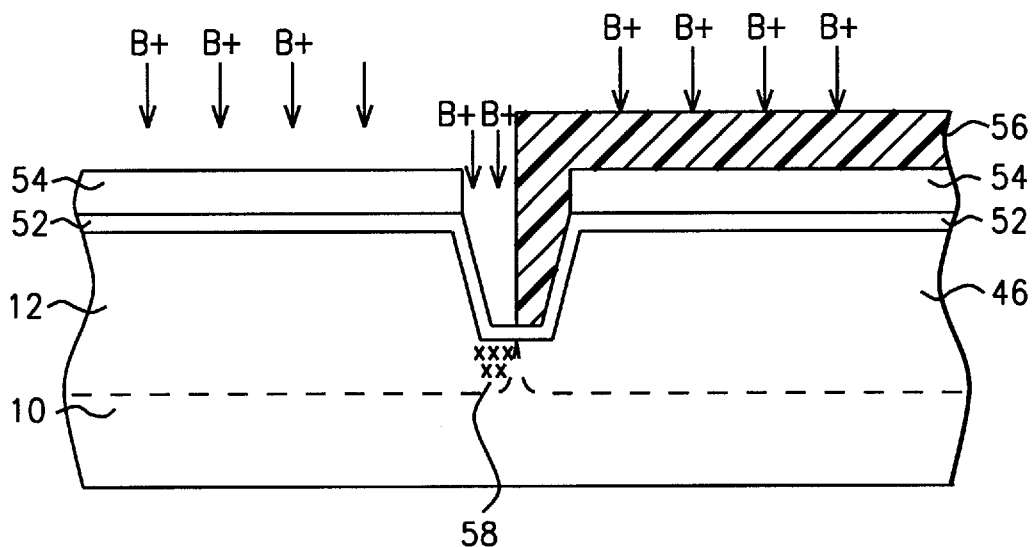
FIG. 5 is a cross section view of a semiconductor device with the N-well area masked and the P well area region under the trench being doped by an donar source according to the method of the invention.

The method of the invention is illustrated in FIG. 5. A second patterning element layer of photoresist is patterned to completely cover the N well area 14 from the midpoint of the unfilled trench 24 over the P/N-well area boundary 26. A suitable acceptor implant such as boron (B) is then performed with a typical energy of between 6 KeV and 60 KeV resulting in a typical dopant level between 1 E 12 and 1 E 15 atoms/cm$^2$ to provide an enriched donar area 58 immediately under the trench in the P well region. This dopent region reduces the sheet resistance in the P well region reducing the susceptibility to latchup and improving the N$^+$ to N well isolation. The Ni$_3$S$_4$ layer 54 shields the remainder of the P well region minimizing any dopent perturbation near the surface of the active area and consequently not changing the device threshold characteristic.

Figure 6:
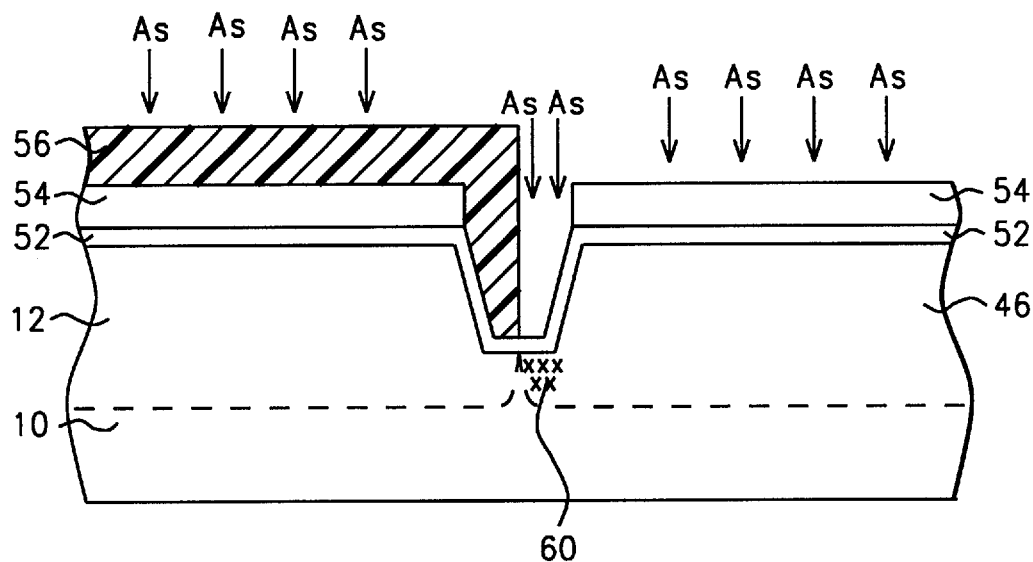
FIG. 6 is a cross section view of a semiconductor device with the P well area masked by photoresist and the N well area under the trench being doped by an acceptor source according to the method of the invention.

FIG. 6 depicts another aspect of the invention. The photoresist over the N well region is then stripped, and a new third patterning element layer of photoresist 56 is appropriately patterned over the P well region from the center of the unfilled trench 24. A suitable donar implant such as arsenic (As) or phosphorous is next performed with a typical energy of between 6 KeV and 60 KeV resulting in a typical dopant level between 1 E 12 and 1 E 15 atoms/cm$^2$ in the P well region directly below the trench. This dopent region reduces the sheet resistance in the P well region reducing the susceptibility to latchup and improving the N$^+$ to N well isolation. Again, the Ni$_3$S$_4$ layer 54 over the remainder of the N well region minimizes any dopent perturbation near the surface of the active area and consequently does not change the device threshold characteristics. Phosphorous (P) can be used in place of As as the donar source.

After the donar (n) and acceptor (p) implants directly under the trench region are completed as described above, the device processing continues in a normal manner as is well known in the industry. For instance, the trench is filled and capped with a dielectric, typically SiO$_2$. Chemical mechanical polishing (CMP) can be used to planarize the surface after capping. Source/drain patterning, doping, gate electrode polysilicon deposition, contact metallization and passivation processes typically complete the device structure. The method of the invention eliminates the need for an implant in the field region under the STI structure which has often been used previously in order to modify the device resistance in this region.

Typical N well sheet resistance near the P/N well boundary is in the range of 1 Kohm per square and greater for the previous process while with the process of the invention the N well resistance is reduced to approximately 400 ohm per square. P well resistance measurements show similar results.

Threshold voltage measurements for previous process devices verses the process described by the invention show threshold voltages within the same values as previously, that is in the nominal range of 0.57 to 0.63 volts.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit semiconductor device with improved latchup protection on a semiconductor substrate whose surface has a first layer of pad oxide on top of which is a first layer of Si$_3$N$_4$ comprising:

defining with a first patterning element isolation structure areas on said semiconductor substrate surrounding and electrically isolating active device areas, said device areas being a PMOS device area and a NMOS device area;

etching a shallow opening in said semiconductor substrate for an isolation structure;

removing said first patterning element;

providing a second oxide layer on the bottom and side walls of said open isolation structure;

providing a second patterning element covering said PMOS device area to the center of said open isolation structure;

implanting first ions into said semiconductor substrate to form a doped region under the bottom of said NMOS side of said open isolation structure;

removing said second patterning element from said PMOS device area;

providing a third patterning element covering said NMOS device area to the center of said open isolation structure;

implanting second ions into said semiconductor substrate to form a doped region under the bottom of said PMOS side of said open isolation structure;

removing third patterning element from said NMOS device area;

filling said open isolation structure with a dielectric;

completing the fabrication of said semiconductor device.

2. The method according to claim 1 wherein said isolation structure consists of shallow trench isolation.

3. The method according to claim 1 wherein said second pattering element consists of a photoresist mask with a layer thickness between about 0.4 and 1.0 um.

4. The method according to claim 1 wherein said first ions consist of boron ions implanted with a dosage of between 1E 12 to 1 E 14 atoms/cm$^2$ and with an energy level between 5 and 60 KeV.

5. The method according to claim 1 wherein said third patterning element consists of a photoresist mask with a layer thickness between about 0.4 and 1.0 um.

6. The method according to claim 1 wherein said second ions consist of arsenic ions implanted with a dosage of between 1E 12 to 1 E 14 atoms/cm$^2$ and with an energy level between 5 and 60 KeV.

7. The method according to claim 1 wherein said second ions consist of phosphorous ions implanted with a dosage of between 1E 12 to 1 E 14 atoms/cm$^2$ and with an energy level between 5 and 60 KeV.

8. The method according to claim 1 wherein said isolation structure dielectric consists of silicon dioxide.

9. A method of fabricating an integrated circuit semiconductor device with improved latchup protection on a semiconductor substrate whose surface has a first layer of pad oxide on top of which is a first layer of Si$_3$N$_4$ and has a N-well active device area for a PMOS device and a P-well active device area for a NMOS device and which a first patterning element has defined a boundary region with an open shallow trench which walls are passivated with a layer of oxide comprising:

providing a second patterning element covering said PMOS device area to the center of said open shallow trench, implanting first ions into said semiconductor substrate to form a doped region under the bottom of said NMOS side of said open shallow trench, removing said second patterning element from said PMOS device area, providing a third patterning element covering said NMOS device area to the center of said open shallow trench, implanting second ions into said semiconductor substrate to form a doped region under the bottom of said PMOS side of said open shallow trench, removing third patterning element from said NMOS device area, filling said open shallow trench with a dielectric, completing the fabrication of said semiconductor device.

10. The method according to claim 9 wherein said second pattering element consists of a photoresist mask with a layer thickness between about 0.4 and 1.0 um.

11. The method according to claim 9 wherein said first ions consist of boron ions implanted with a dosage of between 1E 12 to 1 E 14 atoms/cm$^2$ and with an energy level between 5 and 60 KeV.

12. The method according to claim 9 wherein said third patterning element consists of a photoresist mask with a layer thickness between about 0.4 and 1.0 um.

13. The method according to claim 9 wherein said second ions consist of arsenic ions implanted with a dosage of between 1E 12 to 1 E 14 atoms/cm$^2$ and with an energy level between 5 and 60 KeV.

14. The method according to claim 9 wherein said second ions consist of phosphorous ions implanted with a dosage of between 1E 12 to 1 E 14 atoms/cm$^2$ and with an energy level between 5 and 60 KeV.

* * * * *